US006538932B2

(12) United States Patent
Ellis et al.

(10) Patent No.: US 6,538,932 B2
(45) Date of Patent: Mar. 25, 2003

(54) TIMING CIRCUIT AND METHOD FOR A COMPILABLE DRAM

(75) Inventors: Wayne F. Ellis, Jericho, VT (US); John A. Fifield, Underhill, VT (US); Louis L. Hsu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/880,598

(22) Filed: Jun. 13, 2001

(65) Prior Publication Data
US 2002/0191448 A1 Dec. 19, 2002

(51) Int. Cl.[7] .............................................. G11C 7/00
(52) U.S. Cl. ....................................... 365/194; 365/233
(58) Field of Search ........................... 365/194, 189.11, 365/230.06, 233, 189.09

(56) References Cited

U.S. PATENT DOCUMENTS

| 5,499,215 A | * | 3/1996 | Hatta ........................... 365/149 |
| 5,542,067 A | * | 7/1996 | Chappell et al. ............. 365/203 |
| 6,002,633 A | | 12/1999 | Oppold et al. ........... 365/230.03 |
| 6,111,796 A | * | 8/2000 | Chang et al. ................. 365/190 |
| RE36,851 E | * | 9/2000 | Shinozaki ............... 365/189.01 |
| 6,297,999 B2 | * | 10/2001 | Kato et al. .................... 365/149 |
| 6,314,048 B1 | * | 11/2001 | Ishikawa ...................... 365/190 |

OTHER PUBLICATIONS

Patent application, Programmable Delay Element and Synchronous DRAM Using the Same, Dkt. No. BU9–99–236, Filing Date, Dec. 10, 2000, Ser. No. 09/501,216, 33 pages and 6 sheets of drawings.

* cited by examiner

Primary Examiner—David Nelms
Assistant Examiner—Thong Le
(74) Attorney, Agent, or Firm—Schmeiser, Olsen & Watts; Robert A. Walsh

(57) ABSTRACT

A semiconductor memory is disclosed, the memory comprising: a memory cell adapted to store a bit; a wordline and a bitline coupled to the memory cell; a primary sense amplifier coupled to the bitline to receive a signal representing the stored bit when the wordline is active; a wordline driver coupled to activate the wordline; and a primary delay device adapted to produce a first delay selected from a range of selectable delays, the primary delay device adapted to compensate for signal propagation delay along the wordline.

10 Claims, 12 Drawing Sheets

TIMING CIRCUIT AND METHOD FOR A COMPILABLE DRAM

FIELD OF THE INVENTION

The present invention relates to the field of dynamic random access memory (DRAM); more specifically, it relates to a compilable DRAM and a method for designing the compilable DRAM.

BACKGROUND OF THE INVENTION

A compilable DRAM is a DRAM generated by a DRAM compiler. A DRAM compiler is a computer program containing algorithms based on a methodology that can synthesize different memory configurations to satisfy a customer's needs for an embedded DRAM in their circuit design. Generally, these are custom designs for application specific integrated circuits (ASICs). The specific DRAM configuration is determined by the customers specification as to memory size, word width, number of words, and number of memory arrays. Compilable DRAMs are desirable because they are denser than SRAMs (static random access memory) and take up less space. In some cases, the technology (ground rules, materials, processes and performance specifications) of DRAMs may match the technology of other macros in the ASIC more closely than the technology of a SRAM.

FIG. 1 is a diagram of a portion of a DRAM device. In FIG. 1, DRAM device 100 is comprised of sets of memory units 105, each memory unit containing multiple DRAM arrays 110. DRAM arrays 110 are comprised of arrays of individual DRAM cells. The number of DRAM cells in each DRAM array 100 can range from just a few to many millions depending upon the specific application the DRAM device is designed for. DRAM devices 100 also include sets of wordline drivers 115. Each wordline driver 115 drives wordline signals onto wordlines 120. In general, each wordline 120 is comprised of a set of local wordlines connected to groups of DRAM cells within DRAM blocks 110. Local wordlines are strapped together in series to form global wordlines that run the length of memory units 105. There is one wordline driver for each DRAM unit 105. All wordlines 120 in a given memory unit 105, run through, and are coupled to memory cells in each DRAM array 110 of the memory unit. DRAM device 100 further includes sets of bitline drivers 125. Each bitline driver drives data signals to bitline pairs 130. Bitline pairs 130 run orthogonal to wordlines 120. Bitline pairs 130 are coupled to memory cells in one DRAM array 110 of each memory unit 105.

Because of the length of memory units 105 and the fact that wordlines 120 have a finite resistance, a signal impressed on any wordline of any wordline pair will arrive at the DRAM array 110 closest to wordline driver 115 before the signal arrives at the DRAM array farthest from the wordline driver. In advanced DRAM technology, the local wordline are usually formed polysilicon and the straps of metal. Since the metal straps have a sheet resistance of 0.12 ohms/sq. and polysilicon has a sheet resistance of about 300 to 400 ohms/sq. the wordline delay is mainly a function of the resistance/capacitance of the local wordlines for short memory units 105. For longer memory units 105, the delay becomes a complex function of metal and polysilicon delays.

FIG. 2 is a timing diagram for the DRAM device of FIG. 1. In FIG. 2, a wordline signal 150A is the signal reaching the closest DRAM array 110 and a wordline signal 150B is the signal reaching the farthest DRAM array 110. The difference in time between arrivals of the signal is wordline delay "D." After a bitline charge delay "d1," from wordline signal 150A, during which a bitline 155A signal and a bitline-not signal 165A build charge, bitline/bitline-not amplifiers of the closest DRAM array 110, turn on (set) to boost the signal voltage of the bitline and bitline-not signals. Similarly, after a bitline charge delay "d2," from wordline signal 150B, during which a bitline 155B signal and a bitline-not signal 165B build charge, bitline/bitline-not amplifiers of the farthest DRAM array 110 turn on (set) to boost the signal voltage of the bitline and bitline-not signals. Because of wordline delay "D," the set times of the bitline/bitline amplifiers of the closest DRAM array 110 and the bitline/bitline-not amplifiers of the farthest DRAM array 110 must be delayed by the wordline delay "D." In a fixed size DRAM this is not a significant problem as the length of wordlines pairs 120 are fixed and known so a delay device circuit can be designed to simulate the wordline delay "D" and then incorporated into the circuit design to delay turn on (set) of the bitline/bitline-not amplifiers of farthest DRAM array 110, as well as all the intervening DRAM arrays, until the appropriate time. However, in a compilable DRAM, the length is not fixed or known ahead of time, so this approach is not very effective.

FIG. 3 is a schematic diagram of a method of setting timing in a static random access memory (SRAM) device. In FIG. 3, SRAM device 165 includes a closest SRAM array 170A, a farthest SRAM array 170B and a wordline driver 175. Wordline driver 175 drives wordline signals onto a multiplicity of wordlines 180 running from closest SRAM array 170A to farthest SRAM array 170B. Wordlines 180 are coupled to memory cells in each SRAM array of SRAM device 165. A multiplicity of closest bitlines 185A run through closest SRAM array 170A, orthogonal to wordlines 180, and are coupled to cells in the closest SRAM array. A multiplicity of farthest bitlines 185B run through closest SRAM array 170B, orthogonal to wordlines 180, and are coupled to cells in the farthest SRAM array. SRAM device 165 also includes a reference SRAM array 190 and a reference wordline driver 195. Reference wordline driver 195 drives dummy wordline signals onto a reference wordline 200. Reference wordline 200 has the same length and is otherwise a physical replica of wordlines 180. The purpose of reference wordline 200 is to as act a resistive delay model of wordlines 180. Coupled to reference wordline 200, at the end opposite from reference wordline driver 195, is sense device 205. In this example, sense device 205 is a simple inverter. Sense device 205 is used to turn on (set) bitline amplifiers for farthest bitlines 185B. If there are intervening SRAM arrays between closest SRAM array 170A and farthest SRAM array 170B, additional reference wordlines of appropriate length may be placed in reference SRAM array, with additional sense devices for setting bitlines in intervening SRAM arrays, attached thereto.

This approach does not work for an advanced technology compilable DRAM for two reasons. First, is the problem of the composition of wordlines. SRAM wordlines are comprised of master wordlines and local wordlines, each having drivers. In an SRAM, both master and local wordlines are metal and the delay is a straightforward low value metal RC delay (a metal wordline has a sheet resistance of about 0.12 ohms/sq.). As previously discussed, in a DRAM, the wordline is a metal/polysilicon combination with metal straps stitching together polysilicon local wordlines. Second, ground rules for wordlines in SRAM cells are generally larger than the ground rules for wordlines in a DRAM. This forces the use of dummy local wordlines to be placed outside the array of active memory cells for the photolithographic reasons described above. This problem is illustrated in FIG. 4 and described next.

FIG. 4 is an illustration of printed wordlines for an advanced DRAM device. Illustrated in FIG. 4, is an active local wordline set 210 is comprised of an outer active local wordline 215 and inner active local wordlines 220. Also illustrated in FIG. 4, is a dummy local wordline set 225. Dummy local wordline set 225 comprises an inner dummy local wordline 230, a middle dummy local wordline 235 and an outer dummy local wordline 240. Inner dummy local wordline 230 is most adjacent to outer active local wordline 215. One purpose of dummy local wordline set is to mitigate proximity effects on wordlines in active local wordline set 210. All of active local wordlines are shown as printing as designed. Inner dummy local wordline 230 is shown printing somewhat distorted, middle dummy local wordline 235 is shown printing greatly distorted and outer dummy local wordline 240 is only partially printed and is not continuous. If dummy local wordline set 225 were not present, then active local wordlines 215 and 220 would have printed with the distortions illustrated for the dummy local wordlines. Clearly, the inner and middle dummy local wordlines 230 and 235 are not physical replicas of any active local wordline in active local wordline set 210. Inner and middle dummy local wordlines 230 and 235 have different widths therefore different resistances and hence different delays, than any of the wordlines in active local wordline set 210 and would be useless as reference wordlines as illustrated in FIG. 3 and described above.

SUMMARY OF THE INVENTION

A first aspect of the present invention is a semiconductor memory comprising: a memory cell adapted to store a bit; a wordline and a bitline coupled to the memory cell; a primary sense amplifier coupled to the bitline to receive a signal representing the stored bit when the wordline is active; a wordline driver coupled to activate the wordline; and a primary delay device adapted to produce a first delay selected from a range of selectable delays, the primary delay device adapted to compensate for signal propagation delay along the wordline.

A second aspect of the present invention is a semiconductor memory, comprising: a memory cell adapted to store a bit; a wordline and a local bitline coupled to the memory cell; a primary sense amplifier coupled to the local bitline pair to receive a signal representing the stored bit when the wordline is active, the primary sense amplifier coupled to a global bitline pair; a secondary sense amplifier coupled between the global bitline pair and a data driver; a wordline driver coupled to activate the wordline; a primary delay device having a selectable delay, coupled between a wordline driver replica and the primary sense amplifier, the primary delay device producing a first delay signal to time the primary sense amplifier; and a secondary delay device having a selectable delay, coupled between the primary delay device and the secondary sense amplifier to receive the first delay signal, the secondary delay device producing a second delay signal to time the secondary sense amplifier.

A third aspect of the present invention is a method of compensating for propagation delays in a memory device, comprising: providing a memory cell adapted to store a bit; coupling a wordline and a local bitline to the memory cell; coupling a primary sense amplifier between the local bitline and a global bitline, the primary sense amplifier to receiving a signal representing the stored bit when the wordline is active; coupling a secondary sense amplifier between the global bitline and a data driver; coupling a wordline driver to activate the wordline; coupling a primary delay device having a selectable delay between a wordline driver replica and the primary sense amplifier, the primary delay device producing a first delay signal to time the primary sense amplifier; and coupling a secondary delay device having a selectable delay between the primary delay device and the secondary sense amplifier to receive the first delay signal, the secondary delay device producing a second delay signal to time the secondary sense amplifier.

A fourth aspect of the present invention is a computer-readable storage medium encoding a method of designing a semiconductor memory of the type in which a bit stored in a memory cell is transferred to a bitline of a bitline pair coupled to a primary sense amplifier, the primary sense amplifier coupled to a secondary sense amplifier, the secondary sense amplifier coupled to a data driver through a global data line, the bit further being accessed by activating a wordline, the method comprising: calculating a worst case wordline signal delay based upon the number of bitline pairs coupled to a wordline in the memory; and inserting a primary delay device into the memory to time the primary sense amplifiers based upon the calculated worst case wordline signal delay.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
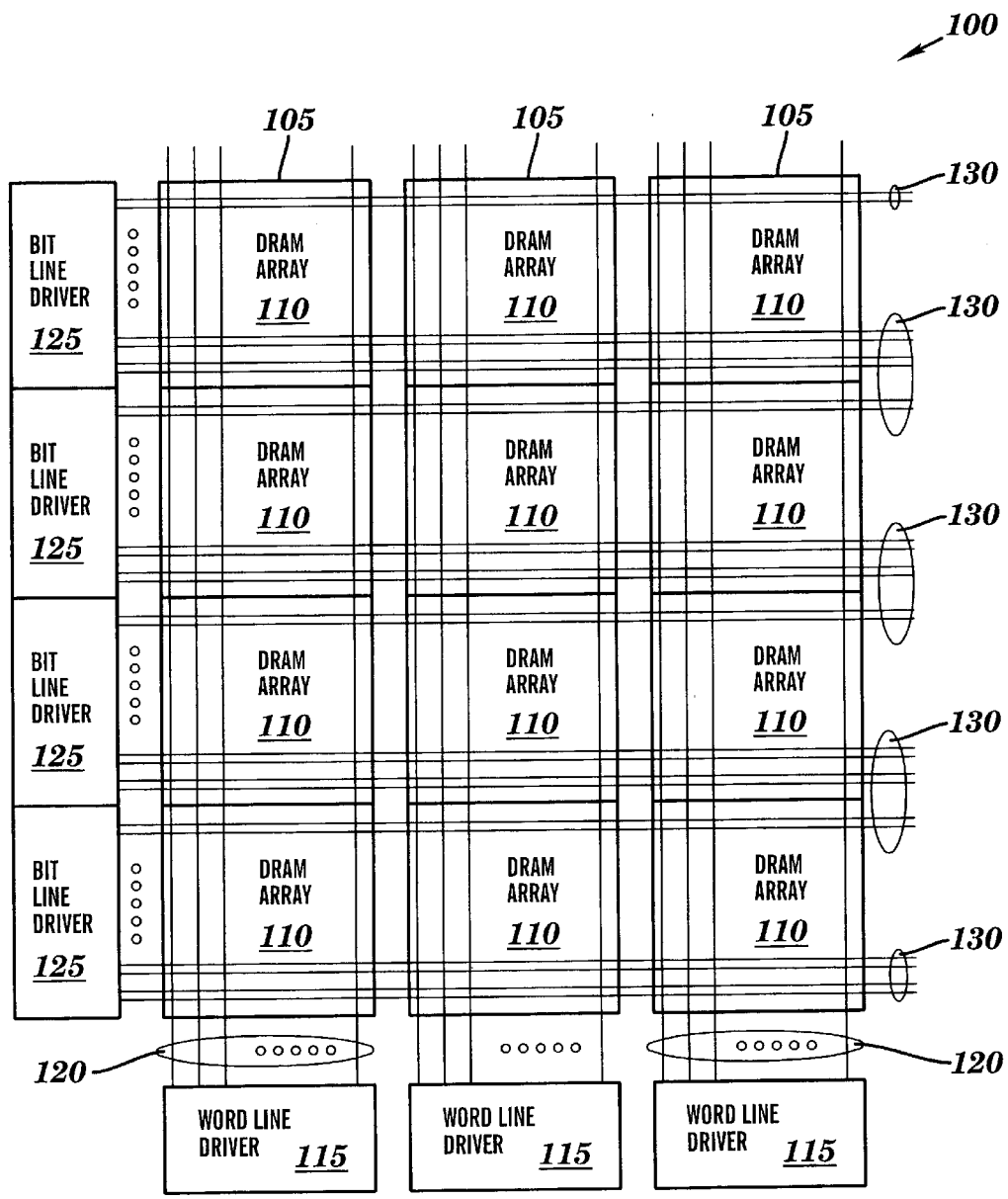
FIG. 1 is a diagram of a portion of a DRAM device.
Figure 2:
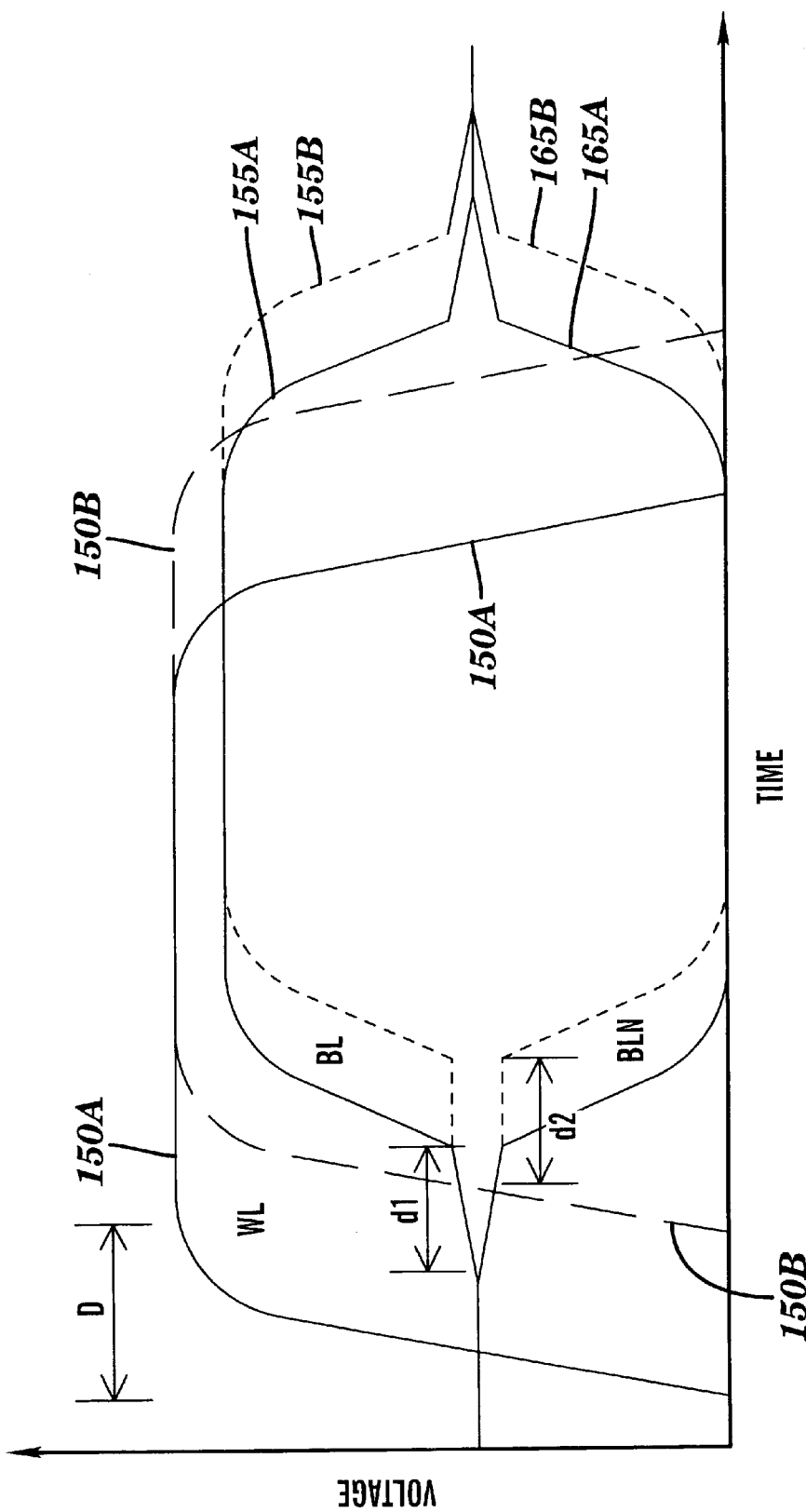
FIG. 2 is a timing diagram for the DRAM device of FIG. 1.
Figure 4:
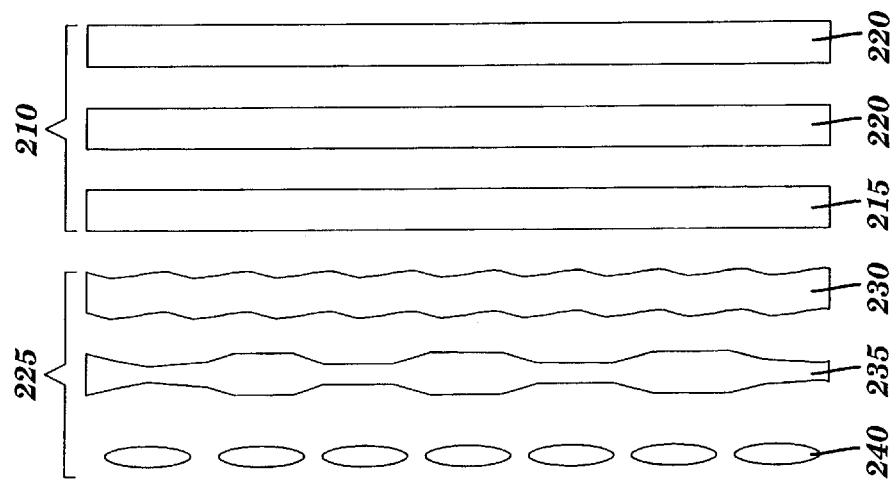
FIG. 4 is an illustration of printed wordlines for an advanced DRAM device.
Figure 3:
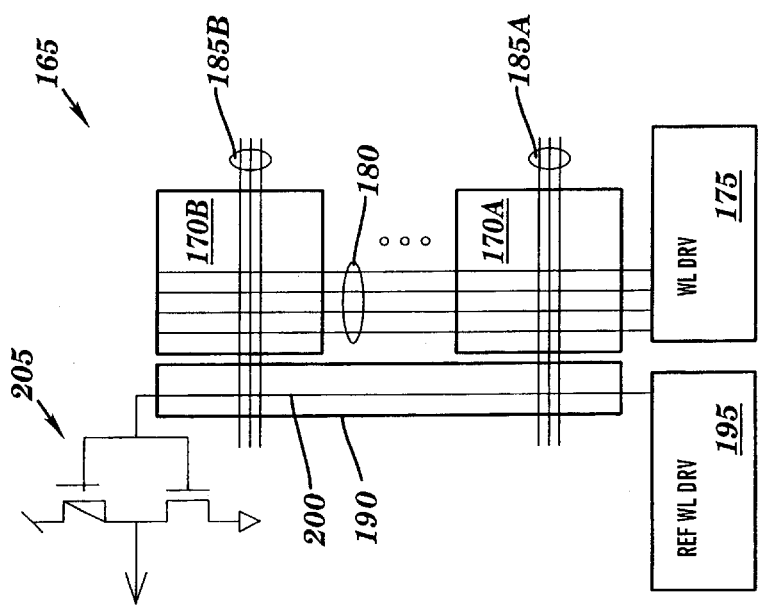
FIG. 3 is a schematic diagram of a method of setting timing in an SRAM device.
Figure 5:
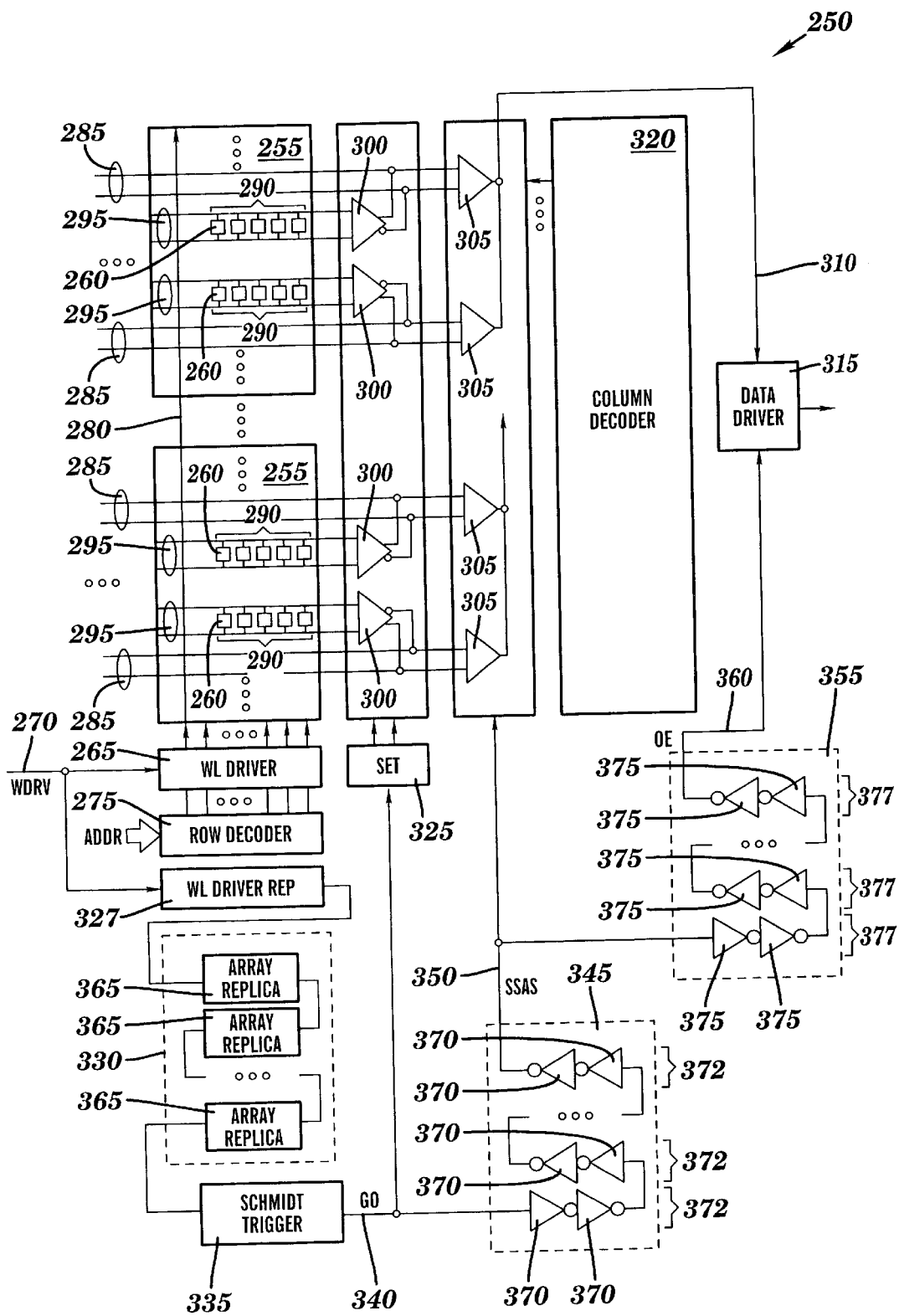
FIG. 5 is a diagram of a DRAM device according to a first embodiment of the present invention.

FIG. 5 is a diagram of a DRAM device according to a first embodiment of the present invention. In FIG. 5, DRAM device 250 is comprised of a set of DRAM arrays 255, each DRAM array containing a multiplicity of memory cells 260. The number of DRAM cells in each DRAM array 255 can range from just a few to many millions depending upon the specific application the DRAM device is designed for. DRAM device 250 also includes wordline drivers 265 for receiving a wordline drive enable signal(WDRV) 270. A row decoder 275 is coupled to wordline driver 265. Row decoder 275 decodes address inputs and directs WDRV 270 thru the corresponding wordline driver 265 onto one of a multiplicity of wordlines 280. There may be additional sets of DRAM arrays 255, row decoders 275 and wordline drivers 265. All wordlines 280 are coupled to memory cells in each DRAM array 255. DRAM device 250 further includes a multiplicity of global bitline pairs 285. Global bitline pairs 285 run orthogonal to wordlines 280.

Within each DRAM array 255, memory cells 260 are arranged into a memory bank 290. Each DRAM cell 260 within memory bank 290 is coupled across a local bitline pair 295. Each local bitline pair 295 is in turn coupled to the inputs of a primary sense amplifier 300. The outputs of each primary sense amplifier are coupled to a global bitline pair 285. There are a multiplicity of memory banks 290; local bit line pairs 295 and primary sense amplifiers 300 combinations within each DRAM array 255. More than one primary sense amplifier 300/memory bank 290 (from the same DRAM array 255 or an adjacent DRAM array) may be coupled to the same global bitline pair 285. Each global bitline pair 285 is coupled to the input of a secondary sense amplifier 305. The output of each secondary sense amplifier 305 is coupled to a global data line 310. Global data line 310 is coupled to a data driver 315. DRAM device 250 also includes a column decoder 320 to determine which secondary amplifier 305 to activate.

In the example of FIG. 5, primary sense amplifiers 300 are differential amplifiers and must be set (placed in a bi-stable mode) by a set circuit 325. Secondary sense amplifiers 305 are turned on by a clock, as is data driver 315. As described earlier, because of the delay in propagation of WDRV 270 the length of wordlines 280, the setting of primary sense amplifiers 300, secondary sense amplifiers 305 and data driver 315 is problematic.

The input to a wordline driver replica 327 is coupled to wordline signal 270. The output of wordline driver replica 327 is coupled to the input of a primary delay device 330. The output of primary delay device 330 is coupled to a Schmidt trigger 335, which produces a GO signal 340 after a first fixed delay. The first fixed delay compensates for the delay in propagation of wordline signal 270 along wordlines 280 and delays turning on of primary sense amplifiers 300 until the wordline signal has reached the furthest memory cell 260 in the furthest DRAM array 255 from wordline driver 265. The output of Schmidt trigger 335 is coupled to set circuit 325 to set primary sense amplifiers 300 and to the input of secondary delay device 345, which produces a secondary sense amplifiers signal (SSAS) 350 after a second fixed delay. The second fixed delay compensates for the worst-case delay along the bitline direction of DRAM array 255 based upon the number of memory banks 290 that are coupled to primary sense amplifiers 300. The output of secondary delay device 345 is coupled to secondary sense amplifiers 305 to clock the secondary sense amplifiers on and to the input of a data delay device 355, which produces an OE (output enable) signal 360 after a third fixed delay. The third fixed delay compensates for the signal propagation delay along the longest global data line 310. The output of data delay device 355 is coupled to data driver 315 to clock data through the data driver.

Primary delay device 330 is comprised of array replicas 365. There is one array replica 365 in primary delay device 330 for each DRAM array 255 in each DRAM array 255/wordline driver 265/row decoder 275 combination. Secondary delay device 345 is comprised of an even number of invertors 370. Invertors 370 provide a delay of SSAS 350 for secondary sense amplifiers 300. Invertors 370 may be arranged in sets of invertors 372 with one set for each DRAM array 255 in each DRAM array/wordline driver 265/row decoder 275 combination (as illustrated) or optionally, a single pair of invertors with larger delay may be used. Data delay device 355 is comprised of an even number of invertors 375. Invertors 375 provide a delay of output enable (OE) signal 360 for data driver 315. Invertors 375 may be arranged in sets of invertors 377 with one set for each DRAM array 255 in each DRAM array/wordline driver 265/row decoder 275 combination (as illustrated) or optionally, a single pair of invertors with larger delay may be used. Though pairs of invertors have been illustrated, any even number of invertors may be substituted.

Figure 6:
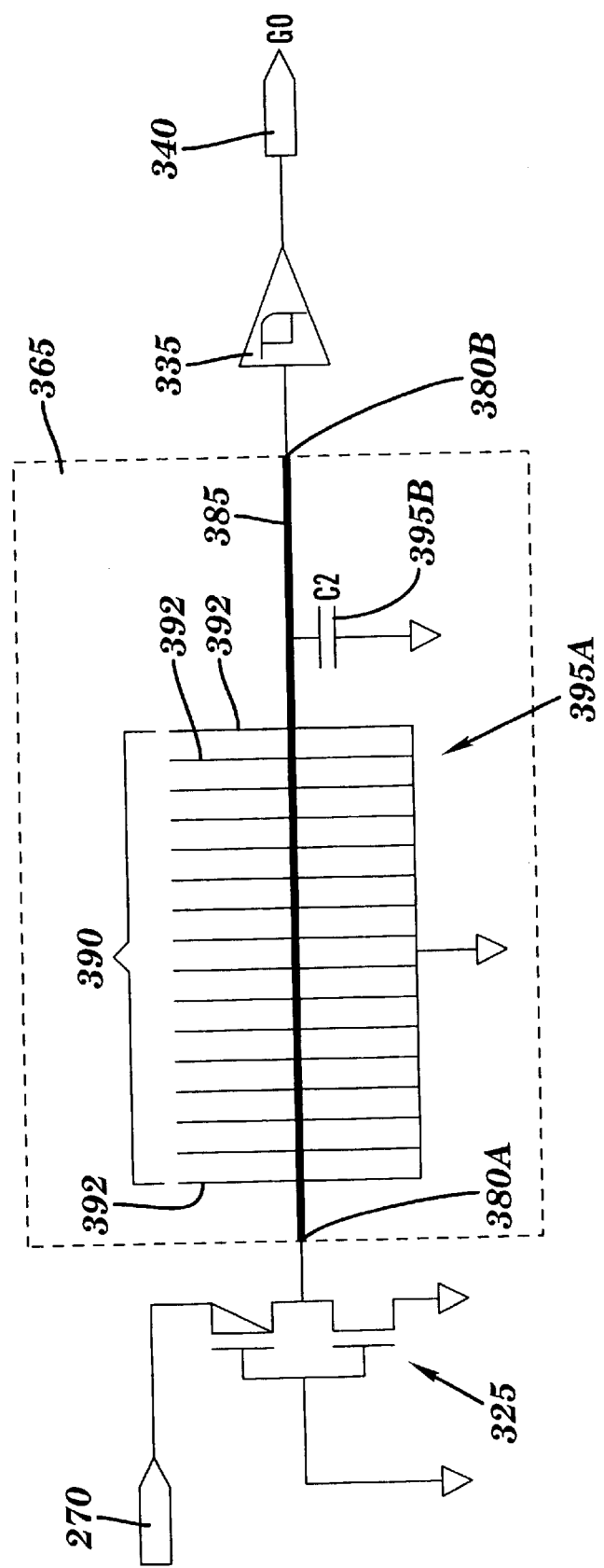
FIG. 6 is schematic circuit diagram of the delay device used in the first embodiment of the present invention.

FIG. 6 is schematic circuit diagram of the delay device used in the first embodiment of the present invention. In FIG. 6, array replica 365 is coupled at a delay device input 380A to wordline driver replica 325, which in this example is a simple inverter, and at a delay device output 380B to Schmidt trigger 335.

Array replica 365 is comprised of a second metal line 385 connecting a delay device input 380A and a delay device output 380B. Arranged orthogonal to and below second metal line 385 is a set of first metal lines 390 comprised of individual parallel and co-planer first metal lines 392. All metal lines 392 in first metal line set 390 are mutually shorted to ground. Second metal line 385 and the second metal lines 392 are separated by an interlevel dielectric (not illustrated) so as no to be in direct electrical contact. The width and height of second metal line 385 is the same as that of any wordline 280. The width, height and spacing of each first metal line 392 in first metal line set 390 is the same as that of global bitline pairs 285 and local bitline pairs 295. The overlap of second metal line 385 with first metal line set 390 forms a first capacitor 395A intended to simulate the capacitance of a section of wordline 280 in DRAM device 250. Coupled between ground and second metal line 385 is a second capacitor (C2) 395B. The purpose of second capacitor 395B is to act a multiplier to first capacitor 395A so only a fraction of wordline 280/global bitline pairs 285/local bitline pairs 295 structure need be fabricated in array replica 365 to simulate the worse case RC delay on wordlines 280.

Figure 7:
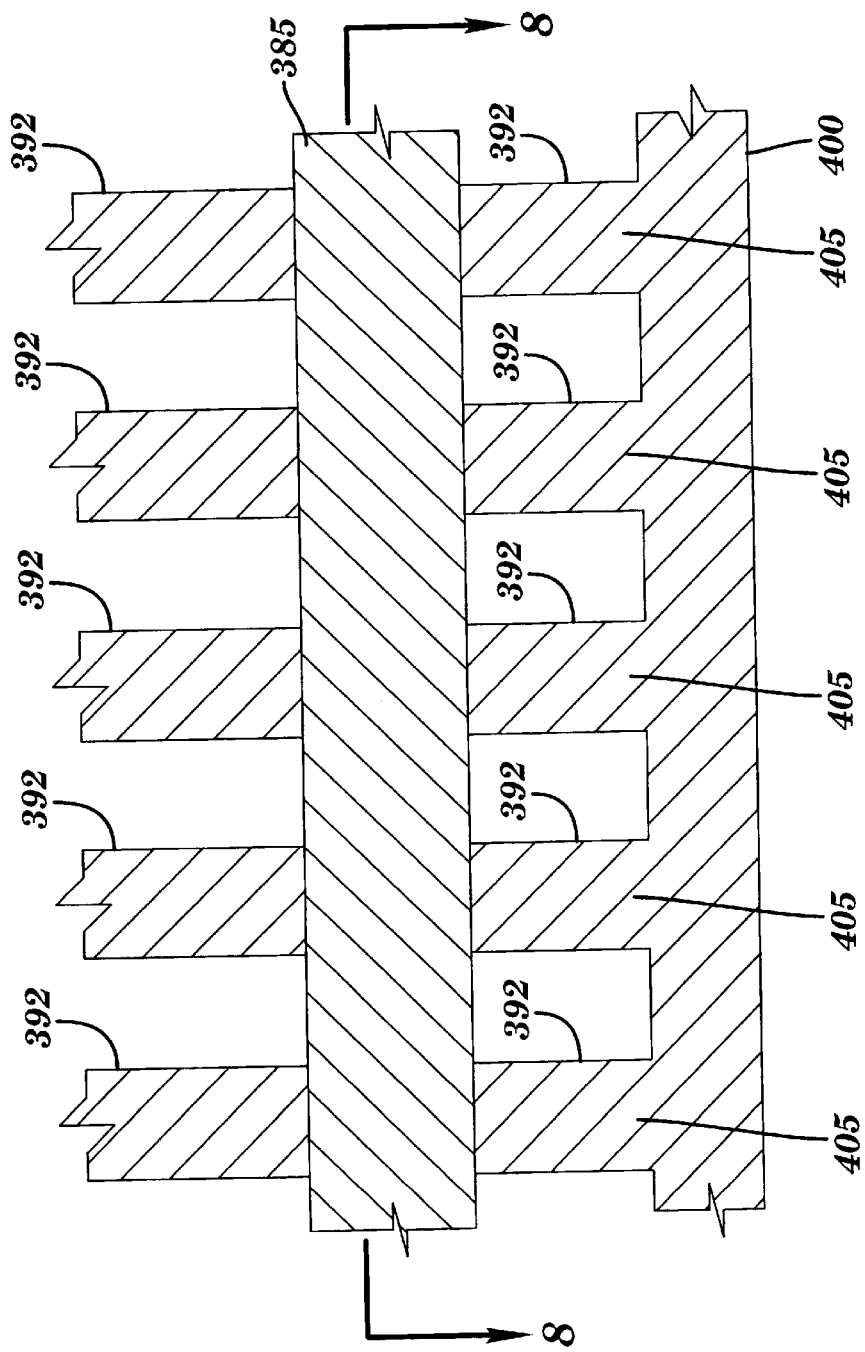
FIG. 7 is a top view of a portion of the delay device of the first embodiment, as it would be fabricated.

FIG. 7 is a top view of a portion of primary delay device 330, of the first embodiment, as it would be fabricated. In FIG. 7, running under second metal line 385, are first metal lines 392. First metal lines 392 are connected to ground line 400 at ends 405.

Figure 8:
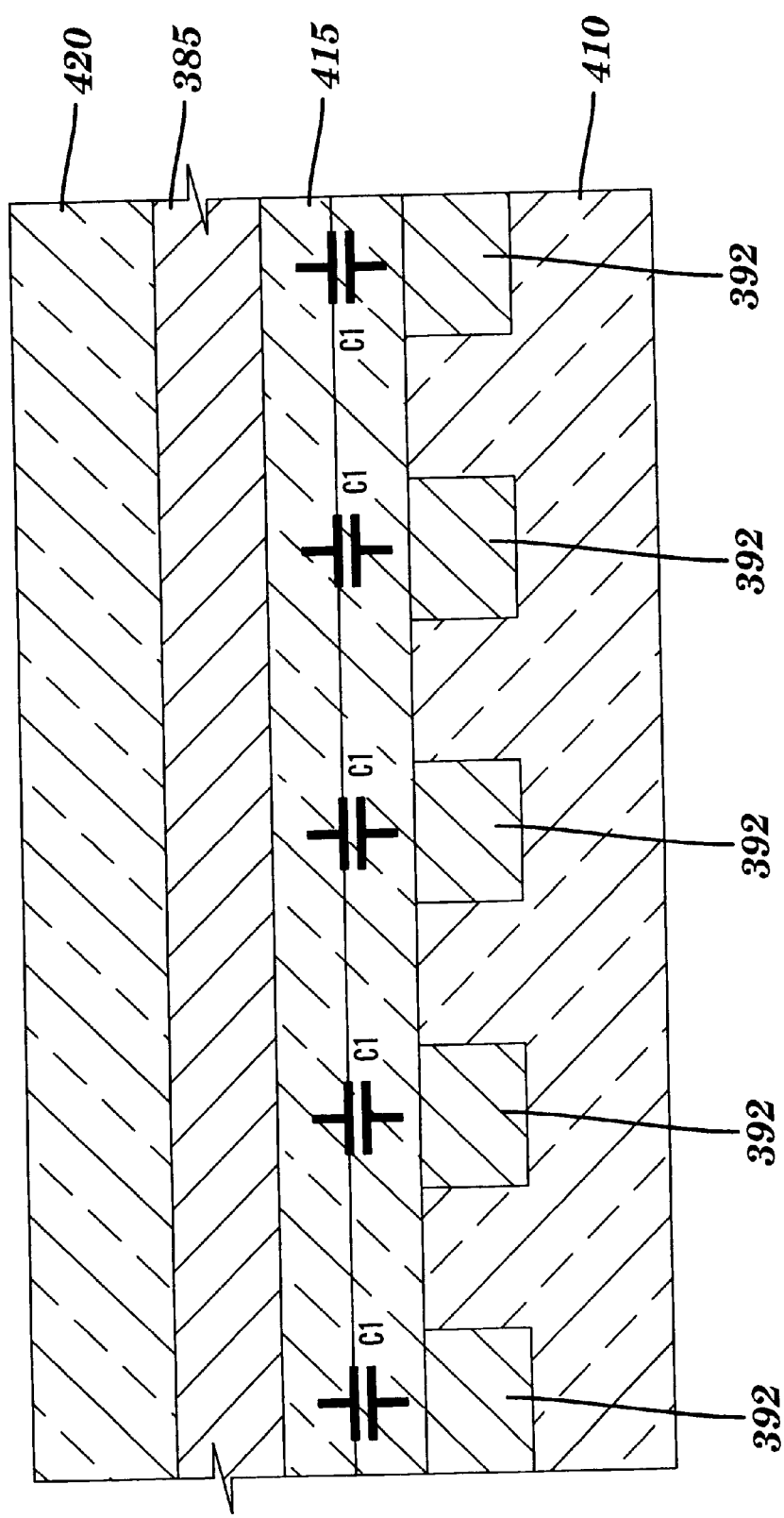
FIG. 8 is a cross-sectional view through section 8—8 of FIG. 7.

FIG. 8 is a cross-sectional view through section 8—8 of FIG. 7. In FIG. 8, first metal lines 392 are embedded in a first interlevel dielectric 410 and covered by a second interlevel dielectric 415. Second metal line 385 is separated from first metal lines 392 by second interlevel dielectric 415. Second metal line 385 is covered by a third interlevel dielectric 420. Second metal line is capacitively coupled to first metal lines 392.

Figure 9:
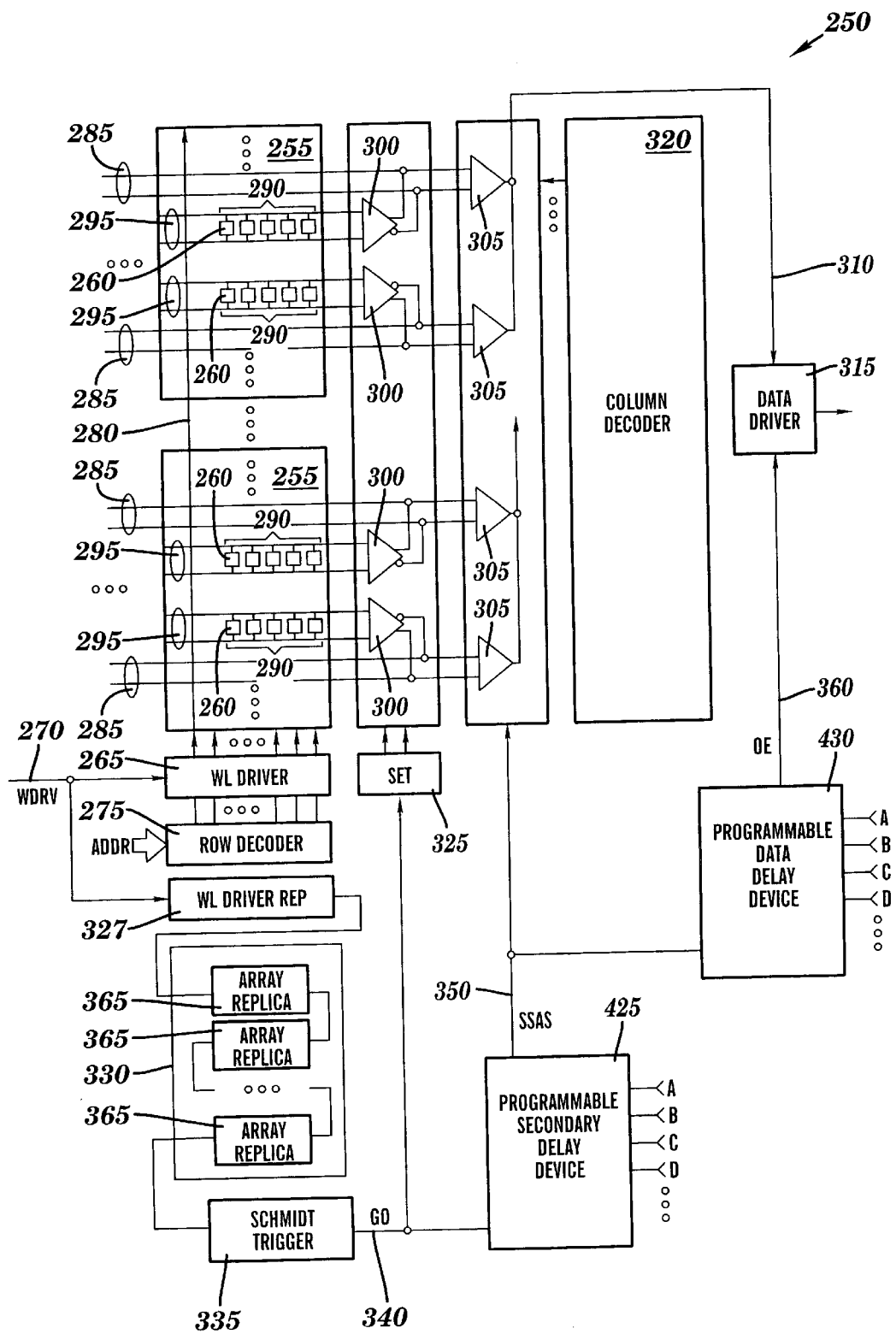
FIG. 9 is a diagram of a DRAM device according to a second embodiment of the present invention.

FIG. 9 is a diagram of a DRAM device according to a second embodiment of the present invention. In FIG. 9, a programmable secondary delay device 425 is used to delay SSAS 350 and a similar programmable data delay device 430, is used to delay OE signal 360.

Figure 10:
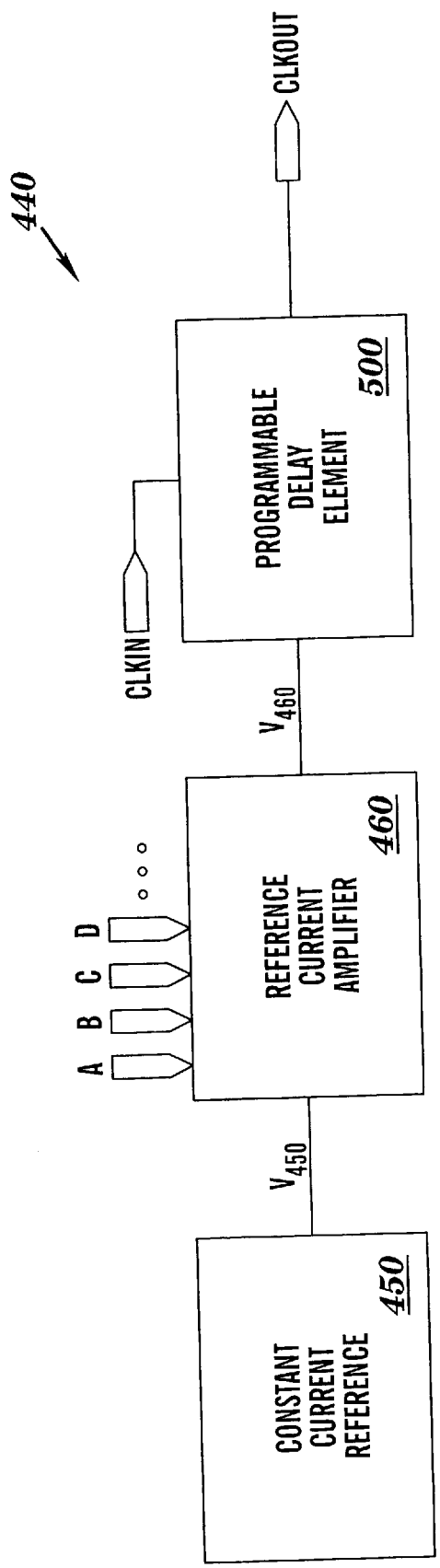
FIG. 10 is a block diagram of a programmable delay device used in the second embodiment of the present invention.

FIG. 10 is a block diagram of programmable secondary delay device 440 used in the second embodiment of the present invention. Programmable data delay device 430 is identical to programmable secondary delay device 425. Of course, the delay programmed into the two delay devices may be different. Programmable secondary delay device 425 includes a constant current reference 450, a reference current amplifier 460 and a programmable delay element 500. Constant current reference 450 provides voltage $V_{4501}$, which reflects a constant current, to reference current amplifier 460. Programmable inputs a, b, c, and d are inputted into reference current amplifier 460, which outputs a reference current, reflected by voltage $V_{460}$, to programmable delay element 500. Programmable delay element 500 receives both voltage $V_{460}$ and input clock CLKIN, and outputs an output clock CLKOUT, which is delayed from CLKIN by a predictable and adjustable amount. As will be discussed in more detail with reference to FIG. 11, advantages of the programmable delay device 425 of the present invention include, inter alia, that CLKIN may be delayed a predictable and adjustable amount based on programmable inputs a, b, c, and d, and that the delay is substantially independent of parametric factors such as temperature variation and threshold voltage. Although only four programmable inputs are shown in FIG. 10 and FIG. 11, reference current amplifier 460 is not limited to any specific number of programmable inputs.

Figure 11:
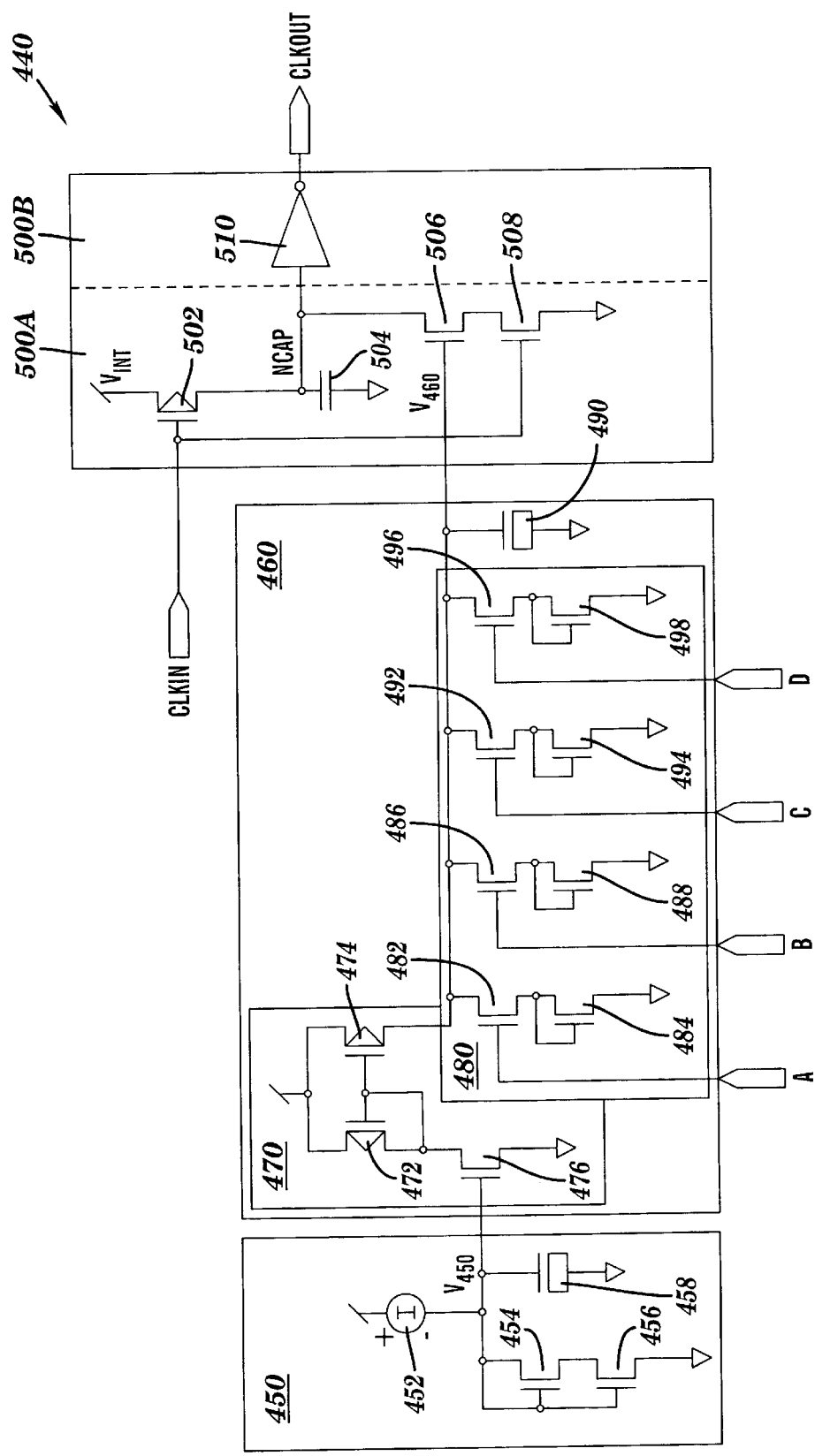
FIG. 11 is a circuit diagram of the programmable delay device illustrated in FIG. 10.

FIG. 11 is a circuit diagram of the programmable secondary delay device 440 illustrated in FIG. 10. Programmable data delay device 430 is identical. Constant current reference 450 may be derived from an on-chip band-gap circuit, which is discussed in detail in U.S. Pat. No. 5,545,978, which is hereby incorporated by reference. Other circuits may also be used to implement the constant current reference 450. Constant current reference 450, as a band-gap equivalent circuit, comprises current source 452, n-type field-effect transistors (NFETS) 454 and 456, and filter capacitor 458. Current source 452 is coupled to the drain and gate of NFET 454, the gate of NFET 456 and to filter capacitor 458. The source of NFET 454 is coupled to the drain of NFET 456. The source of NFET 456 is tied to ground. Examples of numerical values for the components of the constant current reference 450 include, but are not limited to: current source 452 equaling 1.5 micro amps (mA), NFETs 454 and 456 having a beta of 4.8/8 and filter capacitor 458 having a capacitance of 10 picofarads (pF). Through this arrangement, constant current reference 450 provides a constant, stable current of 1.5 mA (reflected by the voltage $V_{450}$) to reference current amplifier 460.

Reference current amplifier 460 includes a current mirror 470 comprising an NFET 476 and a pair of p-type field-effect transistors (PFETs) 472 and 474. Reference current amplifier 460 also comprises four selectable binary weighted reference diodes 480, including NFETs 482, 484, 486, 488, 492, 494, 496 and 498, and a filter capacitor 490. The sources of PFETs 472 and 474 are tied together and are connected to voltage $V_{INT}$. The gates of PFETs 472 and 474 are tied together and are connected to the drain of PFET 472 and the drain of NFET 476. The gate of NFET 476 is coupled to current source 452 of constant current reference 450. The source of NFET 476 is tied to ground. The drain of PFET 474 is coupled to filter capacitor 490, and to the drains of NFETs 482, 486, 492 and 496. The gates of NFETs 482, 486, 492 and 496 are coupled to programmable inputs a, b, c, and d, respectively. The sources of NFETs 482, 486, 492 and 496 are coupled to the drains and gates of NFETS 484, 486, 494 and 498, respectively, with each leg (e.g., NFET 482 and NFET 484) forming a selectable binary weighted reference diode. The sources of NFETs 484, 488, 494 and 498 are tied to ground. Programmable inputs a, b, c, and d may be preset through a mask pattern during device fabrication, laser fuse or other fuse elements, modulation of off-chip pad connections, through configurations of registers, and/or other appropriate methods. The values set on programmable inputs a, b, c and d comprise a control word.

Examples of numerical values for the components of the reference current amplifier 460 include, but are not limited to: NFFT 476 having a beta of 2.4/8; PFET 472 having a beta of 1/1; PFET 474 having a beta of 2/1; NFETs 482, 486, 492 and 496 having betas of 16/1; NFET 484 having a beta of 2/16; NFET 488 having a beta of 4/16; NFET 494 having a beta of 8/16; NFET 498 having a beta of 16/16 and filter capacitor 490 having a capacitance of 10 pF. Because of current mirror 470 and selectable binary weighted reference diodes 480, reference current amplifier 460 precisely controls how much current will go to programmable delay element 500 based on the inputs a, b, c and d.

Programmable delay element 500 comprises PFET 502, trim capacitor 504, NFETs 506 and 508, and inverter 90. The source of PFET 502 is tied to $V_{INT}$. The gate of PFET 502 is coupled to the gate of NFET 508 and clock input CLKIN. The drain of PFET 502 is coupled to trim capacitor 504, the drain of NFET 506 and to the input of inverter 510, forming node ncap. The gate of NFET 506 is tied to the drain of PFET 474 of reference current amplifier 460, wherein NFET 506 functions as a current source for programmable delay element 500. The source of NFET 506 is coupled to the drain of NFET 508, which functions as a CLKIN enable switch. The source of NFET 508 is tied to ground. The relative placement of NFET 506 to N7ET 508 is an advantage, wherein NFET 506 can quickly advance to the saturated region, where the discharge of node ncap is linear, instead of staying in the unpredictable linear region. Therefore, the majority of discharge time of ncap is in the saturated region and any progression of delay as a function of binary selection of reference diodes 480 is linear.

Inverter 510 outputs CLKOUT. Programmable delay element 500 may be designated by 500A, and 500B, wherein the function of inverter 510 (470B) may be integrated into an existing logic gate to provide the benefits of the programmable delay element without causing an insertion delay of inverter 510. Examples of numerical values for programmable delay element 500 include, but are not limited to: PFET 502 having a beta of 32/1; trim capacitor 504 having a capacitance of 480 femtofarads (fF); NFET 506 having a beta of 64/1; NFET 508 having a beta of 24/1 and inverter 510 having a PFET/NFET ratio of 8/25, that is, the inverter comprises a PFET, and an NFET having a beta substantially larger than the beta of the PFET. The unbalanced beta ratio of inverter 510 creates an inverter switch point that is substantially independent of temperature variations, which, as described above, is an advantage of the present invention.

In operation, constant current reference 450 supplies a constant current, reflected by V450 to reference current amplifier 460. The current is then established in NFET 476, reflected in PFET 472, and amplified according to the beta ratios of PFET 472 and PFET 474, resulting in an amplified current flowing in PFET 474. The amplified current is modulated through selectable binary weighted reference diodes 480 and programmable inputs a, b, c and d. In this example, sixteen different combinations may be used to incrementally and linearly create a reference current, which is reflected through $V_{460}$. That is, the more diodes that are turned on through the selection of the programmable inputs, the lower $V_{460}$ will be. Because of the selectable binary weighted reference diodes 480 and current mirror 470, reference current amplifier 460 precisely controls how much current will be reflected in programmable delay element 500 based on programmable inputs a, b, c and d.

The input clock to be delayed, (i.e., CLKIN) is inputted into programmable delay element 500. While CLKIN is low, PFET 502 precharges trim capacitor 504 and the capacitance at ncap to $V_{INT}$. NFET 508 is switched off. Then, when CLKIN is high, PFET 502 is cut off, NFET 508 is switched on and a predetermined amount of current is gated through current source NFET 506 and CLKIN enable switch NFET 508.

The current that is gated through, NFET 506 is predictable through the following equation:

$$I_N = (b_{N506}/b_D)*I_{P474}$$

wherein:

$I_N$=current gated through NFET 506;

$b_{N506}$=beta of NFET 506;

$b_D$=beta of the selected binary weighted reference diode 480; and $I_{P474}$=current flowing through PFET 474.

The current gated through NFET 506 and the discharge of ncap is linear, because of the rapidity with which NFET 506 enters the saturated region. The delay of CLKIN is predicted by the following equation:

$$t = (C_{NCAP}*(V_{INT}-V_{SP}))/I_N$$

wherein; t=delay of CLKIN;

$C_{NCAP}$=capacitance at node ncap;

$V_{INT}$=voltage $V_{INT}$;

$V_{sp}$=voltage of the switch point of inverter 510; and $I_N$=current gated through NFET 506.

Figure 12:
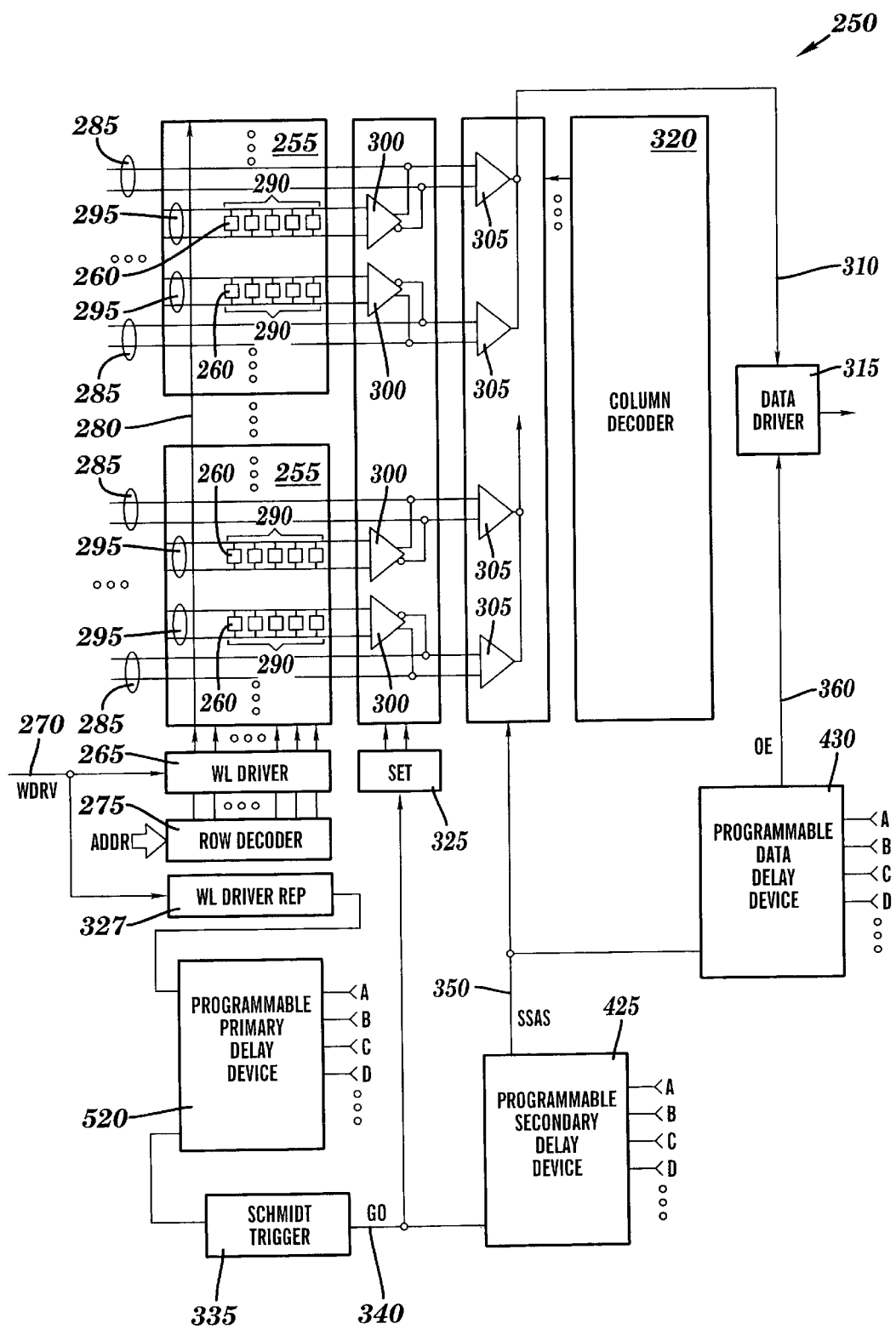
FIG. 12 is a diagram of a DRAM device according to a third embodiment of the present invention.

FIG. 12 is a diagram of a DRAM device according to a third embodiment of the present invention. In FIG. 12, a programmable primary delay device 520 is used to delay GO signal 340 as well as employing programmable secondary delay device 425 to delay SSAS signal 350 and programmable data delay device 430 used to delay OE signal 360. Programmable primary delay device 520 is identical to programmable secondary delay device 425 and programmable data delay device 430. Of course, the delay programmed into the three delay devices may be different.

Figure 13:
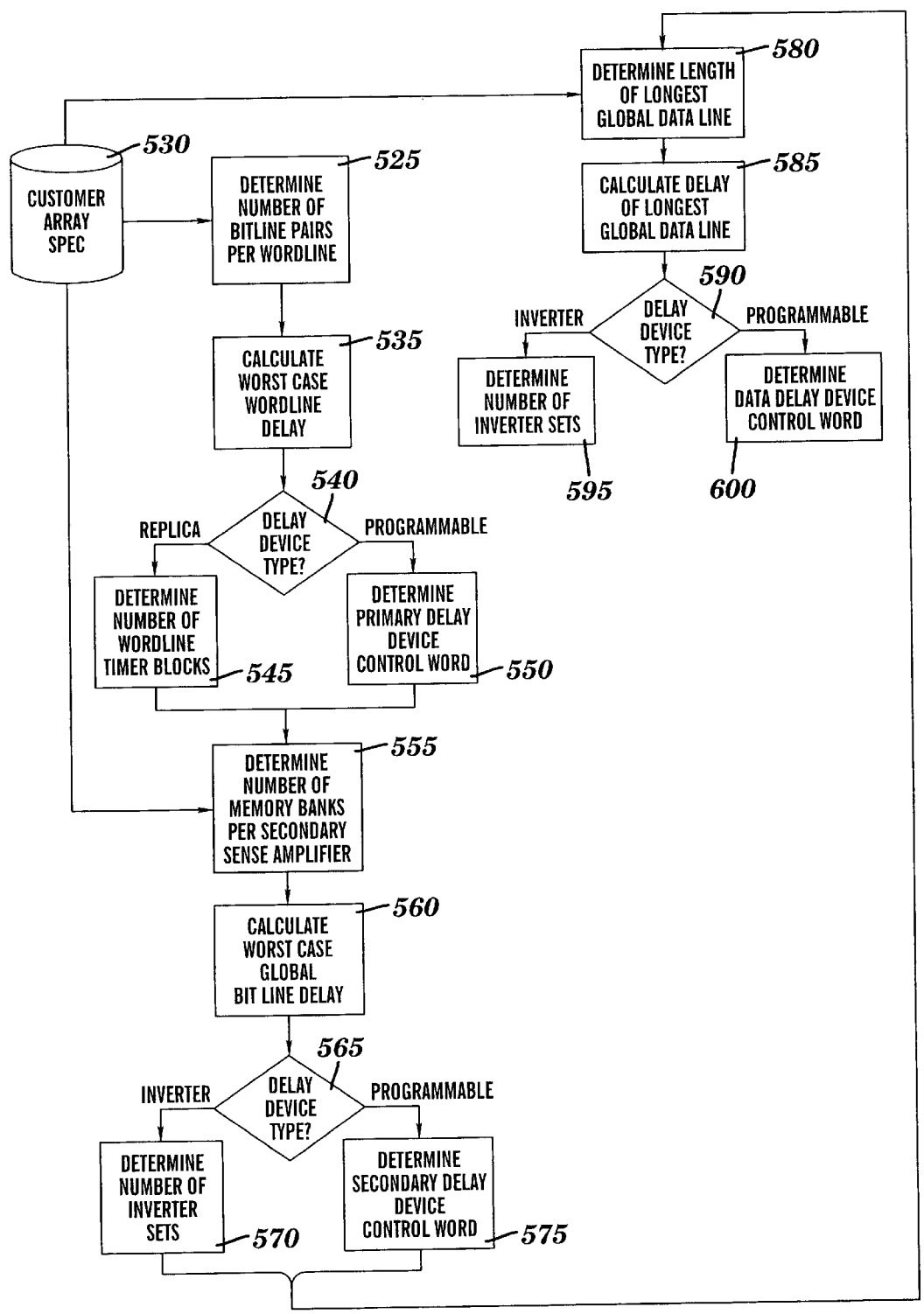
FIG. 13 is a flow chart of a DRAM compiler algorithm according to the present invention.

FIG. 13 is a flow chart of a DRAM compiler algorithm according to the present invention. First, primary sense amplifier 300 signal timing (GO signal 340) is set. In step 525, a memory compiler first determines the number of bitline pairs 280 coupled to each wordline 280 using data contained in a customer array specification 530. The worst-case delay in wordline 280 direction of DRAM device 250 is calculated in step 535, using technology ground rules and the memory design. In step 540, a decision is made as to the type of delay device to use. If the delay device is array replica 365 then in step 545, the number of delay units is determined from the number of DRAM arrays 255 serviced by wordline 280. If the delay device is programmable primary delay device 520 (a programmable delay device) then in step 550, a primary delay control word is determined that gives the best match to the worst-case delay in wordline 280 direction of DRAM device 250.

Second, secondary sense amplifier 305 signal timing (SSAS 350) is set. In step 555, the memory compiler detects the number of memory banks 290 coupled to each secondary sense amplifier 300. Next in step 560, the worst-case delay in global bitline 285 direction of DRAM device 250 is calculated using technology ground rules and the memory design. In step 565, a decision is made as to the type of delay device to use. If the delay device is inverter set 372 (an integer multiple of an inverter pair delay) then in step 570, the number of inverter sets 372 required to match the worst-case delay in global bitline 285 direction of DRAM device 250 is determined. If the delay device is programmable secondary delay device 425 (a programmable delay device) then in step 575, a secondary delay control word is determined that gives the best match to the worst-case delay in global bitline 285 direction of DRAM device 250.

Third, data driver 315 signal timing (OE signal 360) is set. In step 580, the memory compiler detects the length of the longest global data line 310. Next in step 585, the delay of the longest global data line 310 is calculated using technology ground rules and the memory design. In step 590, a decision is made as to the type of delay device to use. If the delay device is inverter set 377 (an integer multiple of an inverter pair delay) then in step 595, the number of inverter sets 377 required to match the worst-case delay of all the global data lines 310 is determined. If the delay device is programmable data delay device 430 (a programmable delay device) then in step 600, a data delay control word is determined that gives the best match to the worst-case delay of all the global data lines 310.

The description of the embodiments of the present invention is given above for the understanding of the present invention. It will be understood that the invention is not to the particular embodiments described herein, but is capable of various modifications, rearrangements and substitutions will now become apparent to those skilled in the art without departing from the scope of the invention. Therefore it is intended that the following claims cover all such modifications and changes as fall within the true spirit and scope of the invention.

What is claimed is:

1. A computer-readable storage medium encoding a method of designing a semiconductor memory of the type in which a bit stored in a memory cell is transferred to a bitline of a bitline pair coupled to a primary sense amplifier, said primary sense amplifier coupled to a secondary sense amplifier, said secondary sense amplifier coupled to a data driver through a global data line, said bit further being accessed by activating a wordline, said method comprising:

calculating a worst case wordline signal delay based upon the number of bitline pairs coupled to a wordline in said memory; and inserting a primary delay device into said memory to time said primary sense amplifiers based upon said calculated worst case wordline signal delay.

2. The computer-readable storage medium of claim 1 wherein said encoded method further comprises:

calculating a worst case bitline signal delay for propagating signals from said primary sense amplifiers to secondary sense amplifiers based upon the number of memory banks coupled to said secondary sense amplifiers; and inserting a secondary delay device into said memory to time said secondary sense amplifiers based upon said calculated worst case bitline signal delay.

3. The computer-readable storage medium of claim 2 wherein said encoded method further comprises:

calculating a worst case data line signal delay for propagating signals along data lines from said secondary sense amplifiers to data drivers based upon a length of a longest data line; and inserting a data delay device into said memory to time said data drivers based upon said calculated worst case data line signal delay.

4. The computer-readable storage medium of claim 1 wherein said encoded method further comprises:

determining the number of array blocks are along the length of said wordline; and providing in said primary delay device one array replica for each said array block.

5. The computer-readable storage medium of claim 1 wherein said encoded method further comprises:

determining a control word based on the worst case wordline signal delay; and providing in said primary delay device a programmable delay device having a delay set by said control word.

6. The computer-readable storage medium of claim 2 wherein said encoded method further comprises:

providing in said secondary delay device a number of pairs of inverters based on the worst case bitline signal delay.

7. The computer-readable storage medium of claim 2 wherein said encoded method further comprises:

determining a control word based on the worst case bitline signal delay; and providing in said secondary delay device a programmable delay device having a delay set by said control word.

8. The computer-readable storage medium of claim 3 wherein said encoded method further comprises:

providing in said data delay device a number of pairs of inverters based on the worst case data line signal delay.

9. The computer-readable storage medium of claim 3 wherein said encoded method further comprises:

determining a control word based on the worst case data line signal delay; and providing in said data delay device a programmable delay device having a delay set by said control word.

10. The computer readable storage medium of claim 1 wherein said semiconductor memory is of a type selected from the group consisting of dynamic random access memory (DRAM), static random access memory (SRAM) and erasable programmable read only memory (EPROM).

* * * * *